United States Patent
Roopchansingh et al.

(10) Patent No.: US 7,395,108 B2
(45) Date of Patent: Jul. 1, 2008

(54) SYSTEM FOR CONCURRENT MRI IMAGING AND MAGNETIC FIELD HOMOGENEITY MEASUREMENT

(76) Inventors: Vinai Roopchansingh, 919 Glenview Ave., Apt. 2, Milwaukee, WI (US) 53213; Robert W. Cox, 8700 Broadmoor Dr., Bethesda, MD (US) 20817; Andrzej Jesmanowicz, 11170 W. Meinecke Ave., Wauwatosa, WI (US) 53226; James S. Hyde, S42 W34076 Hidden Valley, Dousman, WI (US) 53118

( * ) Notice: Subject to any disclaimer, the term of this patent is extended or adjusted under 35 U.S.C. 154(b) by 555 days.

(21) Appl. No.: 10/843,940

(22) Filed: May 12, 2004

(65) Prior Publication Data

US 2004/0254449 A1    Dec. 16, 2004

Related U.S. Application Data

(60) Provisional application No. 60/469,958, filed on May 13, 2003.

(51) Int. Cl.
*A61B 5/05* (2006.01)
*G01V 3/00* (2006.01)
(52) U.S. Cl. ...................................... 600/410; 324/307
(58) Field of Classification Search ................. 600/410, 600/413; 324/309, 311, 313, 318, 331; 382/254
See application file for complete search history.

(56) References Cited

U.S. PATENT DOCUMENTS 6,472,872 B1   10/2002   Jack, Jr. et al.

*Primary Examiner*—Eric F. Winakur
*Assistant Examiner*—Michael T. Rozanski
(74) *Attorney, Agent, or Firm*—Boyle Fredrickson S.C.

(57) ABSTRACT

A technique for acquiring magnetic field maps simultaneously with the images they affect allows improved correction of shimming and/or geometric distortions in the image and allows imaging techniques where subject motion is inevitable or required.

12 Claims, 4 Drawing Sheets

SYSTEM FOR CONCURRENT MRI IMAGING AND MAGNETIC FIELD HOMOGENEITY MEASUREMENT

CROSS-REFERENCE TO RELATED APPLICATIONS

This application claims the benefit of U.S. Provisional Application 60/469,958 filed May 13, 2003 and hereby incorporated by reference.

STATEMENT REGARDING FEDERALLY SPONSORED RESEARCH OR DEVELOPMENT

This invention was made with United States government support awarded by NIH grants EB002014 and EB000215. The United States Government has certain rights in this invention.

BACKGROUND OF THE INVENTION

The present invention relates to magnetic resonance imaging (MRI) and functional magnetic resonance imaging (fMRI) and in particular to a pulse sequence and methodology for acquiring image data contemporaneously with information about variations in magnetic field homogeneity.

Magnetic resonance imaging is used to generate medical diagnostic images by measuring faint radio frequency (RF) signals (magnetic resonance) emitted by atomic nuclei in tissue (for example, water protons) after radio frequency stimulation of the tissue in the presence of a strong magnetic field.

The location of the precessing protons is made possible by the application of orthogonal magnetic gradient fields which serve to "encode" the spins according to frequency, phase, and/or slice. The combination of the radio frequency stimulation and the applied gradient fields is termed a pulse sequence.

The acquired signal from the spins (termed a nuclear magnetic resonance (NMR) signal) provides data in "k-space", a mathematical construction in the frequency domain. A two-dimensional Fourier transform of the k-space data produces the actual image. It will be understood, therefore, that the k-space data does not represent the image itself, but represents the spectral components of the image with the center of k-space representing low frequency spatial components of the image, and the outer portions of k-space representing the high frequency spatial components of the image.

The impressing of spatial location information onto the spins of the NMR signal by the applied magnetic gradients makes it extremely important that all applied magnetic fields (including the polarizing magnetic field $B_0$ and the gradient magnetic fields $G_x$, $G_y$, and $G_z$) be well characterized. For this reason, and particularly for the $B_0$ field, it is well known to incorporate shimming coils into the design of a magnetic resonance imaging machine which serve to correct for inhomogeneities in the $B_0$ field through the application of one or more superimposed shimming fields.

A number of techniques are known by which to measure inhomogeneities of the magnetic field and thus to calculate the currents needed for the shimming coils. For example, special pulse sequences detecting phase differences in the MRI measurements of a homogenous phantom, for example, a tank of water, may be used to deduce variations in the magnetic field of the MRI system.

Shimming of the MRI system may be accomplished with great precision, however, the magnetic homogeneity is upset almost immediately upon insertion of a human subject whose tissue distorts the field. In order to address this problem, it is known to create a magnetic field map once a subject is in position in the MRI machine to compensate for this distortion. Such compensation is particularly important for echo planar imaging (EPI) and spiral imaging where the precessing nuclei have a long period of time in which to be influenced by the magnetic field, and thus to accumulate errors caused by inhomogeneity.

BRIEF SUMMARY OF THE INVENTION

The present inventors have recognized that while magnetic field maps acquired while the subject is in position in the MRI machine can improve static shimming of the MRI machine, these magnetic field maps have two important shortcomings. The first is that the different pulse sequences used to acquire the image and used to acquire the magnetic field map produce different geometric distortions and thus are hard to register. The second is that subject movement between acquisition of the image and the magnetic field map can render the magnetic field map inaccurate with respect to distortions in the image.

Accordingly, the present inventors have developed a technique in which field homogeneity information is collected essentially at the same time as image data and using the same pulse sequence. As a result, changes in magnetic fields accompanying subject movement may be easily matched to the image and the image readily corrected.

Specifically then, the present invention provides an MRI imaging pulse sequence where a magnetic field map and image data are collected contemporaneously. For example, both the magnetic field map and the image may be acquired after a single, common RF pulse.

It is thus one object of at least one embodiment of the invention to provide image and magnetic field map data that are for all practical purposes coincident in time.

The magnetic field map may be acquired during the low order k-space line acquisitions of the image data.

Thus it is another object of at least one embodiment of the invention to make use of the same gradient fields to acquire the image.

Only low order k-space lines need be obtained for the magnetic field map.

It is thus another object of at least one embodiment of the invention to reduce acquisition time by limiting the magnetic field map to low spatial frequency variations. More generally, the invention allows the amount of redundant data collected for the field map to be traded for acquisition time. If a short acquisition time is required, only a few lines of redundant data can be collected. If longer times are permitted, then a larger number of redundant lines of data can be collected.

The pulse sequence may be a partial k-space acquisition and the full k-space data set may be mathematically extrapolated.

Thus it is another object of at least one embodiment of the invention to provide another method of allowing the amount of data collected to be traded for acquisition time.

The magnetic field map may be used to correct for susceptibility distortions in the associated image.

Thus it is another object of at least one embodiment of the invention to provide concurrent correction of image data for susceptibility-induced distortions. Although susceptibility induced distortion arises during patient motion, susceptibility distortion cannot be corrected by standard motion correction techniques that rely on simple translations and rotations of the acquired images. The invention therefore provides a technique useful to augment motion correction for acquisitions where subject motion is expected or intended, such as fMRI studies where the subject speaks, and where even small amounts of distortion can prevent proper image registration.

Multiple sets of image data and magnetic field map data may be acquired over time and an earlier magnetic field map may be used to provide control of the shimming coils of the MRI system to correct later images. The later magnetic field map may be then used to further correct the image for susceptibility effects.

Thus it is another object of at least one embodiment of the invention to allow for real time physical shimming of the magnetic field with and without later susceptibility corrections.

The magnetic field map may be used to discard particular images in a time series having excessive susceptibility error.

Thus it is a further object of the invention to use the magnetic field map to cull bad image data from sets of images.

These particular objects and advantages may apply to only some embodiments falling within the claims and thus do not define the scope of the invention.

DETAILED DESCRIPTION OF THE PREFERRED EMBODIMENT

Figure 1:
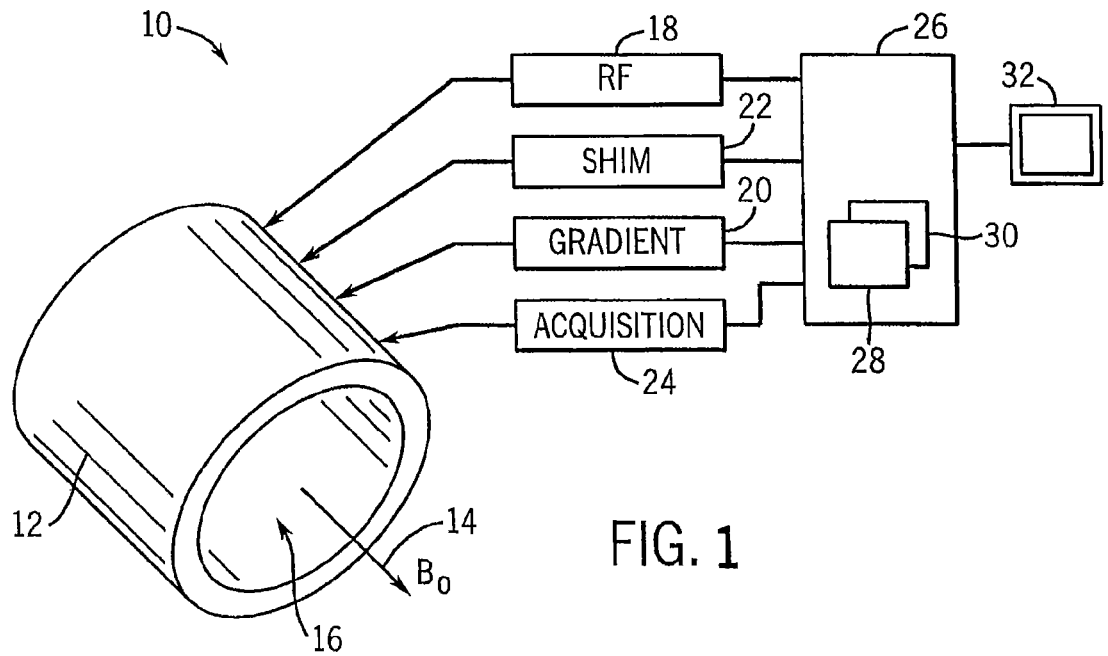
FIG. 1 is a simplified schematic representation of a magnetic resonance imaging apparatus showing a coil driving and acquisition circuitry connected to a controller controlling the MRI system and communicating with a user interface.

Referring now to FIG. 1, magnetic resonance imaging machine 10 includes a magnet 12 providing for a substantially uniform $B_0$ field 14 within a bore 16 that may hold a subject. The magnet 12 supports a radio frequency coil (not shown) that may provide a radio frequency excitation to protons of the subject (not shown) within the bore 16. The radio frequency coil communicates with an RF pulse subsystem 18 producing the necessary electrical waveform as is understood in the art.

The magnet 12 also supports three axes of gradient coils (not shown) of a type known in the art which communicate with a corresponding gradient subsystem 20 providing electrical power to the gradient coils to produce gradient coil functions $G_x$, $G_y$, and $G_z$ over time. Also supported by the magnet 12 are multiple shimming coils (not shown) which communicate with shimming subsystem 22 to produce shimming magnetic fields within the bore 16.

Finally, an NMR acquisition subsystem 24 connects to RF reception coils positioned within the magnet 12.

Each of the subsystems 18 through 24 communicates with a central controller 26 which generates pulse sequences comprised of RF pulses from RF subsystem 18 and gradient pulses from gradient coil subsystem 20, and which receives NMR signals through NMR acquisition subsystem 24. The controller 26 operates according to one or more stored control programs 28 that may define the pulse sequences and which may operate on data 30 collected from the NMR acquisition subsystem 24 to produce images that may be displayed on console 32. The console 32 also allows the input of data including programs and commands to the controller 26.

Figure 2:
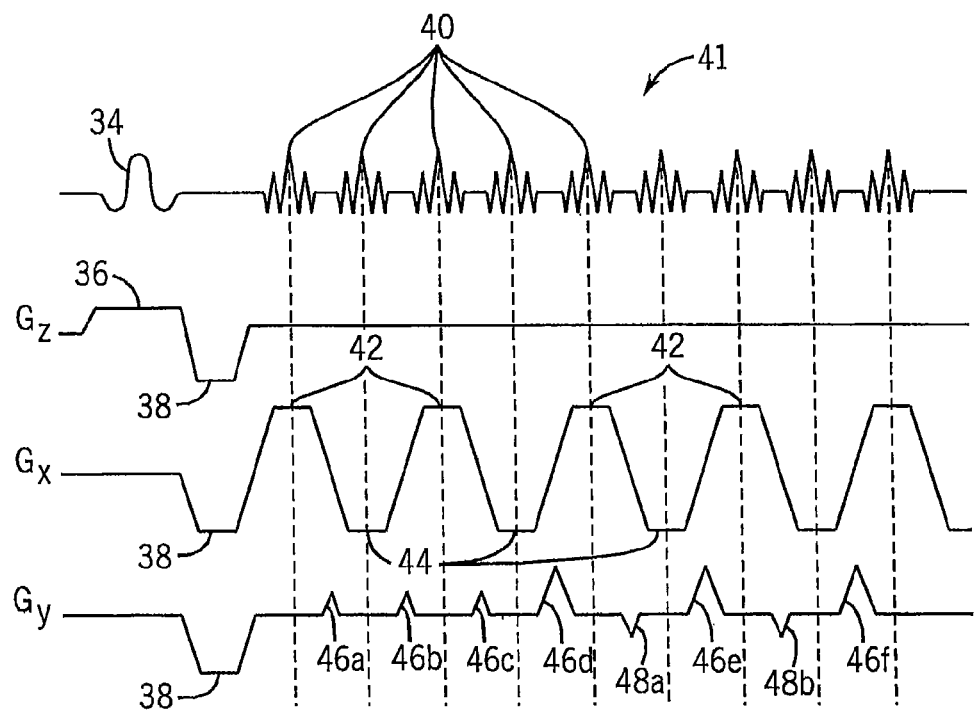
FIG. 2 is a pulse sequence suitable for use with the present invention to collect both image and magnetic field map data.

Referring now to FIG. 2, in an echo planar gradient recalled imaging sequence suitable for use with the present invention, an RF excitation pulse 34 is generated at the beginning of the pulse sequence using the RF subsystem 18. During the excitation, a $G_z$ slice encoding gradient 36 may be generated along the z-axis (aligned with $B_0$) to excite into resonance only spins contained in a predefined slice.

Each of the gradients $G_x$, $G_y$, and $G_z$ then provide for prephasing pulses 38 of a type well known in the art and $G_x$ is controlled to produce a series of echoes 40 represented by echo train 41 whose acquisitions each provide a line of k-space data as will be described. The $G_x$ gradient series produces either a positive frequency encoding pulse 42 or a negative frequency encoding pulse 44 used to generate the echo train 41. As will be understood in the art, the positive frequency encoding pulse 42 provides for a left to right traversal of k-space (in the $k_x$ direction) whereas the negative frequency encoding pulse 44 provides a right to left traversal of k-space eliminating the need for unproductive rewinding in k-space.

In between each echo 40 of the echo train 41, the $G_y$ gradient provides a phase encoding pulse 46 and 48 which moves the path of k-space traversal in the $k_y$ direction downward for positive phase encoding pulses 46 and upward for negative phase encoding pulses 48.

Figure 3:
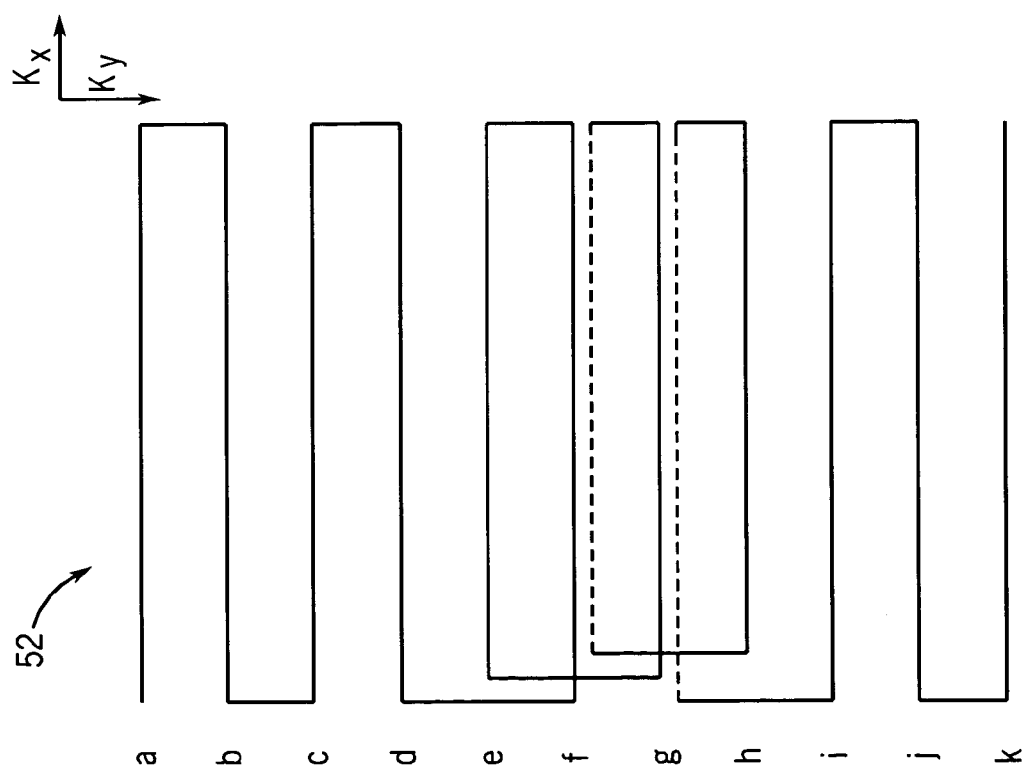
FIG. 3 is a representation of k-space showing a "moving racetrack" trajectory in k-space providing two traversals of the same line of k-space for magnetic field and image data collection.

Referring now to FIGS. 2 and 3, for the first four lines of k-space labeled: a, b, c and d, positive phase encoding pulses 46a-46c are of equal area causing three equal steps through k-space downward in the $k_y$ direction after each k-space line of data is acquired. Subsequent positive phase encoding pulse 46d, however, has twice the area of positive phase encoding pulses 46a-46c causing the next line of k-space acquired to be line f skipping line e.

The next phase encoding pulse is a negative phase encoding pulse 48a equal in area magnitude to the area magnitude of positive phase encoding pulses 46a-46c (but negative in sign) to cause a backtracking or retracing in the $k_y$ direction of the trajectory of acquisition back to line e after line f has been acquired.

This negative phase encoding pulse 48a is followed by positive phase encoding pulse 46e equal in area to positive phase encoding pulse 46d and similarly reinstituting a forward motion along $k_y$ in k-space to k-space line g.

A next negative phase encoding pulse 48b retraces in the $k_y$ direction to rescan line f previously scanned. Thus line f is scanned twice in opposite directions separated by a predetermined interval in time.

This negative phase encoding pulse 48b is followed by positive phase encoding pulse 46f equal in area to positive phase encoding pulse 46d and similarly reinstituting a forward motion along $k_y$ in k-space to k-space line h. A similar process as described above causes line g to be scanned twice in opposite directions separated by the same predetermined interval in time as the two scans of line f. Lines i, j and k are then scanned in succession without multiple scanning.

Thus lines f and g are both scanned twice and the remaining lines scanned once. The phase of the image data evolves in time from the moment of the RF excitation pulse 34 and is proportional to magnetic field strength as derived from the Bloch equations. The Bloch equation is well known in the art and described in Magnetic Resonance Imaging: Physical Principles and Sequence Design, E. Mark Haacke, Robert W. Brown, Michael R. Thompson and Ramesh Venkatesan, Editors. John Wiley & Sons, New York (1999) hereby incorporated by reference. Thus, the phase difference of images derived from the k-space data of lines f and g reveal the magnetic field strength over the area of the image and variations in that field strength reveals inhomogeneities.

Figure 4:
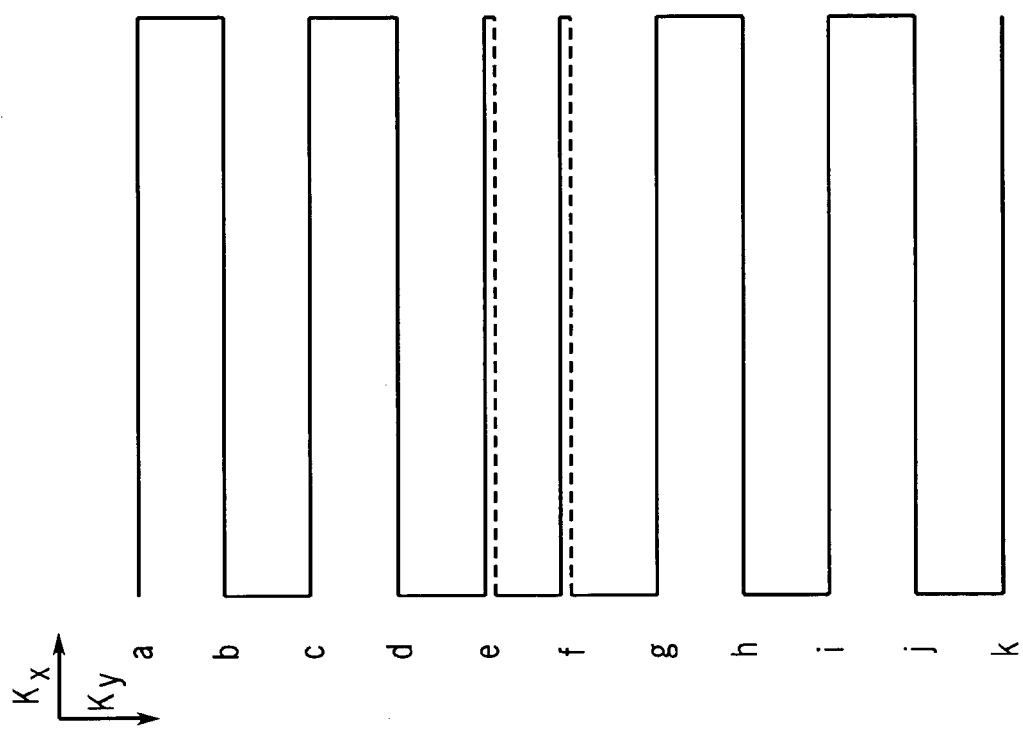
FIG. 4 is a figure similar to that of FIG. 3 showing an alternative trajectory in k-space less delay between the two traversals of the same lines of k-space.

Referring now to FIG. 4, in an alternative embodiment, lines e and f, for example, may be acquired twice successively without the intervening acquisition of other k-space lines. In this case, given positive phase encoding pulses 46 are simply suppressed to cause a retracing in k-space. In this case, the time separation between redundant acquisitions is less, with the result that sensitivity is somewhat reduced but the danger of phase "roll-over" in which phase information becomes ambiguous, is reduced.

Note that in both cases, a full plane of k-space image data is acquired for the purpose of constructing an image and the doubly acquired data for the purpose of generating the magnetic field map is limited to a few lines. These lines are preferentially center k-space lines so as to provide for the important low spatial frequencies in the magnetic field map. High spatial frequency information for the magnetic field map preferably not acquired so as to limit the increase of the acquisition time, but this is optional and the amount of high frequency data acquired may be flexibly adjusted according to acquisition speed requirements.

Figure 5:
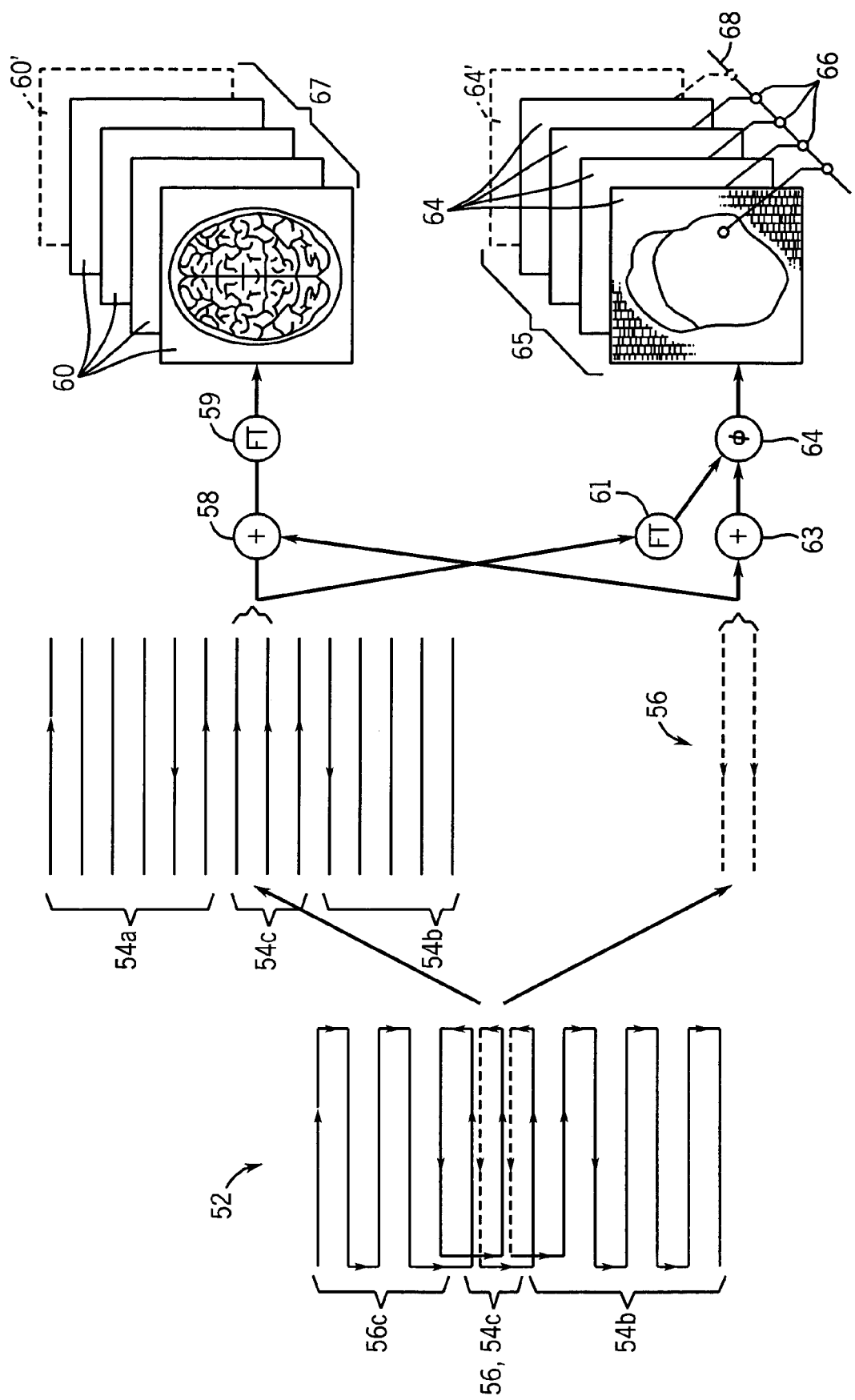
FIG. 5 is a schematic representation of the processing of the data acquired in FIGS. 3 and 4.

Referring now to FIG. 5, generally many single lines of k-space data 52 covering an entire plane will be obtained including edge k-space image data 54a and 54b providing high frequency image data and center k-space image data 54c providing low frequency image data. Duplicated or redundant lines of k-space magnetic field data 56 providing low frequency magnetic field map data will preferentially but optionally cover only a few lines near the center of k-space.

For each application of the pulse sequence per FIG. 2, the center k-space image data 54c and the duplicated lines of k-space magnetic field data 56 are summed by summing block 58 (implemented by program 28) to make full use of the additional image data in the duplicated lines of k-space magnetic field data 56 to increase the signal-to-noise ratio of this k-space data. The output of summing block 58 is then combined with edge k-space image data 54a and 54b and transformed by a two-dimensional Fourier transform of transform block 59 to produce an image 60 for each echo 40. The pulse sequence of FIG. 2, having a single RF excitation pulse 34 producing a echo train 41 with multiple echo 40 thus produce the data for a single image 60 and its corresponding magnetic field map 64. Repeated applications of the pulse sequence of FIG. 2 over time result in a time course 67 of images 60 over a period such as may provide the basis for a functional magnetic resonance imaging (fMRI) study as will be understood to those of ordinary skill in the art and an example of which will be described below. The images 60 may be displayed on the console 32 and further manipulated as is understood in the art.

The duplicated lines of k-space magnetic field data 56 and center k-space image data 54c are then reconstructed using a two dimensional Fourier transform per blocks 61 and 63 or other technique and the resulting phase information analyzed by phase analyzer 64 per the Bloch equation to produce a magnetic field map 65 for each echo 40. The same repeated applications of the pulse sequence of FIG. 2 over time used to generate the time course 67 of images 60 also result in a time course of magnetic field maps 64, each of which provides a snapshot of the changing in homogeneities in the magnetic field of the MRI machine 10.

Figure 6:
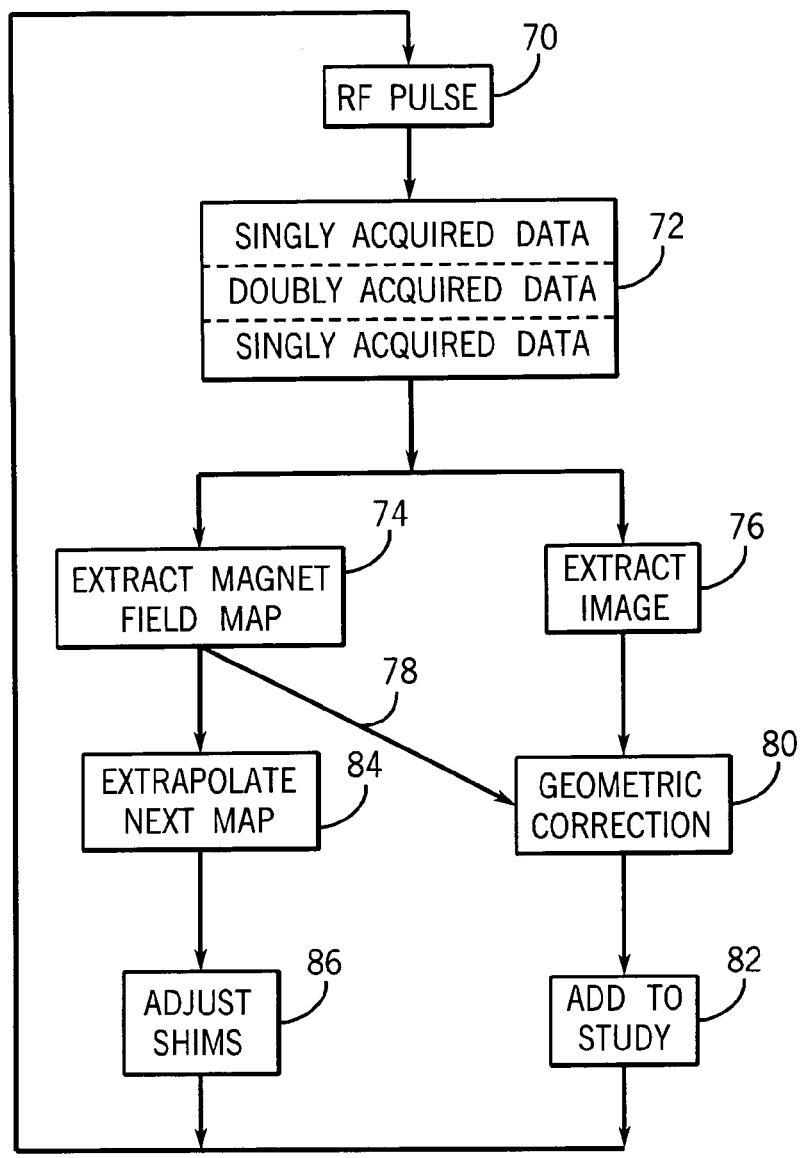
FIG. 6 is a flow chart showing the steps of a program executed by the controller of FIG. 1 in the present invention.

Referring now to FIG. 6, the program 28 operating in the controller 26 of the MRI machine 10 provides in an RF excitation pulse 34 per process block 70 after which multiple lines of k-space data as described above may be acquired as indicated by process block 72.

As described above, a magnetic field map is extracted from the doubly sampled k-space data near the center of k-space as indicated by process block 74 while image data are extracted from the combined doubly sampled and singly sampled k-space data as indicated by process block 76.

In one embodiment, each magnetic field map 64 of process block 74 may be used as indicated by arrow 78 to correct the corresponding image 60 of process block 76 (that is the image derived from the same data acquired at the same time) as indicated by process block 80. Each of these corrected images may be added to a time series study as indicated by process block 82. Alternatively, at process block 80, images 60 that have more than a predefined distortion from magnetic field inhomogenities detected at process block 74 may be discarded.

Referring to FIG. 5, generally the correction on an image 60 is effected by phase shifting the underlying k-space data of the image 60 according to the inhomogeneity measured by the corresponding magnetic field map 64. This correction, in one embodiment, may be applied only within a zone defined by a predetermined high intensity portion of the image 60 which approximates the portion of the image occupied by the subject. Note that the phase correction must be modified according to the time separation between the acquisitions of the k-space lines which is no longer uniform because of the double sampling. Thus, generally phase corrections in the $k_y$ direction are shifted by half as much in the outer lines of k-space than the central lines when double sampling occurred.

In a second embodiment, each magnetic field map 64 of process block 74 may be used as indicated by process blocks 84 and 86 to correct the magnet shimming for the next image 60 (that is the image derived from the data acquired after the next RF excitation pulse 34). This may be done using the most recent magnetic field map 64 only or from an extrapolation of the magnetic field map 64 and previous magnetic field maps 64.

As shown in FIG. 5, this extrapolation may, for example, fit a curve to a value of corresponding pixels 66 in several previous magnetic field maps 64, to deduce an extrapolated value for the corresponding pixel 68 of a next magnetic field map 64'. This extrapolation, repeated for each pixel 66 in the previous magnetic field maps 64, predicts the next magnetic field map 64' and may be used to adjust the shimming coils of the magnet 12 through shimming subsystem 22 for the next image 60'.

Dynamic shimming is made possible by the present invention which allows both magnetic field map information and image data to be obtained using a single RF pulse, at little penalty, on a near real-time basis.

Through the geometric correction of process block 80 and the shimming of process block 86, either of which may be performed alone or together, distortion caused by magnetic inhomogeneity and the long readout times of echo planar imaging and other similar techniques are substantially reduced.

Figure 7:
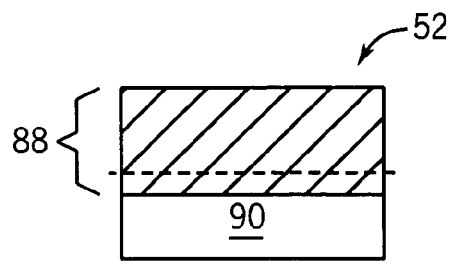
FIG. 7 is a schematic representation of k-space showing a partial k-space acquisition.

Referring now to FIG. 7, the increase in acquisition time caused by the double sampling of the present invention may be reduced by combining the present invention with a technique of acquiring approximately half of the k-space data 88 and filling the missing k-space data in with the Hermitian conjugate formation 90 described in detail in "Single-Shot Half k-Space High-Resolution Gradient-Recalled EPI For fMRI At 3 Tesla" by Andrzej Jesmanowicz, Peter A. Bandettini and James S. Hyde, Magnetic Resonance in Medicine 40:754-762 (1998), hereby incorporated by reference. In this case, the center lines of k-space may be acquired two more times after the full k-space trajectory has been completed and used to correct mismatches that can occur between forward and backward $k_x$ lines of k-space.

Alternatively, the partial k-space acquisitions can be used to provide higher spatial resolution of the image as described in the above-cited paper. More generally, the above partial k-space acquisition allows flexibility in trading acquisition time against image resolution in the context of the present invention.

The invention may find use not only in fMRI studies, but also in imaging of ostensibly static anatomical structures where involuntary patient motion nevertheless may be a concern. Here the echo planar gradient recalled pulse sequence can be tailored to enforce a relatively short acquisition window to reduce blurring of the image during involuntary motion at the expense of signal-to-noise ratio. The echo planar gradient recalled pulse sequence is intrinsically fast and may be further increased in speed, if desired, through the use of the partial k-space acquisition technique described above.

Motion of the patient during multiple acquisitions of time series 67 thus resolves itself as a series of shifted images 60, each with low motion blur, but with the patient captured in different relative positions. Combining these images 60, to improve the signal-to-noise ratio, can be done in theory by correcting for the motion (adjusting the relative position of the patient in each image by means of rigid body translations and rotation) and then averaging the corresponding pixels of the images, on a pixel by pixel basis. Motion correction of this type, relying on an analysis of correlation between the images with varying amounts of rotation and translation, is well known in the art.

As a practical matter, however, precise motion correction required to generate a high signal-to-noise composite image is hampered by the susceptibility distortion introduced into the image data when a patient moves within a magnetic polarizing field shimmed for a different patient position. This susceptibility distortion, which is not uniform over the image, cannot be corrected by rigid body displacement of the image (typical motion correction) and thus hampers precise alignment of the images needed for their combination. Misalignment effectively reintroduces blur into the composite image.

Accordingly, referring to FIG. 6, the present invention further contemplates that at process block 82, the susceptibility distortion corrected images from process block 80 (optionally as corrected by dynamic shimming of process block 86), are motion corrected then averaged to produce a sharp, high signal-to-noise ratio composite image.

EXAMPLE I

As described briefly above, each application of RF excitation pulse 34 results in an image 60. In this context, the RF excitation pulse 34 is sometimes referred to as "single shot". Each of the echoes 40 in the echo train 41 produces a line of k-space. A representative time to acquire an image 60 is 100 milliseconds. A time TR, typically 2 seconds, is defined as the time between acquisitions of an image 60 from a particular slice, however, within TR, multiple images 60 of different parallel slices, for example 20, can be acquired allowing image data to be acquired from an extended volume of tissue. This is termed "multislice acquisition".

In an fMRI study, to which the present invention may be advantageously applied, data are acquired by imaging the entire human brain using 20 slices 5 millimeters thick where each slice is imaged 128 times over the course of a study. Thus a time equal to 128×TR=256 seconds is typically required to collect the fMRI data.

An "image time course" 67 of images 60 (shown in FIG. 5) is defined as consisting of 128 images 60 from a single slice. Typically there may be 20 such image time courses 67 to cover the entire brain. It follows that a typical whole brain fMRI data set consists of 20×128=2560 images 60. Each of these 2560 images requires application of the pulse sequence shown in FIG. 2.

According to the present invention, 2560 magnetic field maps 64 are also produced in a typical FMRI experiment corresponding to the 2560 images. There are 20 magnetic field map time courses 65 (shown in FIG. 5) in this example corresponding to the 20 image time courses 67. The 20 magnetic field map 64 acquired within each TR provide a mapping of the complete brain. However the 20 magnetic field map 64 are not perfectly registered in time with each other since the underlying data of each magnetic field map 64 is acquired, typically, displaced in time by 100 ms. Such a time course of whole brain magnetic field maps do, however, characterize magnetic field variation in time that occur slower than the TR value.

Each volume element ("voxel") of tissue is sampled in this example 128 times. A voxel of tissue gives rise to a pixel 66 describing signal intensity in an image. Thus each voxel gives rise to a "pixel time course" of image intensity. A "voxel magnetic field time course" can be produced from the magnetic field map time course data that corresponds to each pixel time course.

The present invention is particularly useful for fMRI studies in which jaw and tongue motion may be present, for example, where the study requires speaking by the subject. Here, the susceptibility changes caused by anatomical motion may be corrected to better reveal the blood oxygen level-dependent (BOLD) effect or similar fMRI signals. It is specifically intended that the present invention not be limited to the embodiments and illustrations contained herein, but include modified forms of those embodiments including portions of the embodiments and combinations of elements of different embodiments as come within the scope of the following claims.

We claim:

1. An MRI acquisition method comprising the steps of:
   (a) placing a subject in a polarizing magnetic field;
   (b) applying an RF excitation pulse to the subject; and
   (c) acquiring concurrent magnetic field map data and image data from echoes of the same RF excitation pulse, the magnetic field map data and image data providing data at a plurality of points over an area of the subject; wherein the magnetic field maps are comprised of at least two parallel and spaced apart, doubly-sampled lines of k-space data;
   whereby differences between geometric distortions in the image data and measurements of the geometric distortions by the magnetic field map resulting from different pulse sequences are suppressed and spatial mis-registration and time shifts between the magnetic field map and the image data are reduced.

2. The MRI acquisition method of claim 1 wherein the magnetic field map data is used to correct susceptibility distortions in the concurrent image data.

3. The MRI acquisition method of claim 1 further including the steps of repeating steps (b) and (c) and of processing the multiple image data to produce a functional magnetic resonance image.

4. The MRI acquisition method of claim 1 further including the steps of repeating steps (b) and (c) and of using earlier acquired magnetic field map data to adjust currents in shim coils of an MRI scanner for acquisition of later image data.

5. The MRI acquisition method of claim 1 further including the step of causing the subject to move muscles of the subjects head or neck during the acquisition of concurrent magnetic field map data and image data.

6. The MRI acquisition method of claim 1 further including the step of analyzing the magnetic field map data and discarding selected image data based on a predetermined excessive susceptibility distortion indicated by the magnetic field map data.

7. The MRI acquisition method of claim 1 wherein the concurrent magnetic field map data and image data are derived from lines of k-space some of which are scanned more than once, and wherein the k-space lines scanned more than once are combined to create image data and compared to create magnetic field map data and wherein the difference between the times of scanning the lines of k-space that are scanned more than once is constant for different lines of k-space that are scanned more than once.

8. the method of claim 1 wherein the step of acquiring concurrent magnetic field map data and image data acquires the data of both from echoes of a single RF excitation pulse.

9. An MRI acquisition method comprising the steps of:
    (a) placing a subject in a polarizing magnetic field;
    (b) applying a series of RF excitation pulses to the subject to collect magnetic resonance data for a series of images and corresponding magnetic field maps within each pulse sequence defined by an RF excitation pulse so that pairs of magnetic field maps and images are obtained from a single RF excitation pulse and so that each magnetic field map is comprised of at least two parallel and spaced apart, doubly-sampled lines of k-space data; and
    (c) correcting each of the series of images for magnetic susceptibility distortion according to its paired magnetic field maps,
    (d) correcting the series of images for motion;
    (e) combining the series of images to produce a composite image having improved signal-to-noise ratio.

10. the method of claim 9 wherein the magnetic field maps and images providing data at a plurality of points over an area of the subject.

11. the method of claim 9 wherein the data of the magnetic field maps include at least two lines of k-space data.

12. the method of claim 9 wherein the data of the magnetic field maps include at least two lines of k-space data.

* * * * *

UNITED STATES PATENT AND TRADEMARK OFFICE
CERTIFICATE OF CORRECTION

PATENT NO.        : 7,395,108 B2
APPLICATION NO.   : 10/843940
DATED             : July 1, 2008
INVENTOR(S)       : Roopchansingh et al.

Page 1 of 1

It is certified that error appears in the above-identified patent and that said Letters Patent is hereby corrected as shown below:

| | |
|---|---|
| CLAIM 5<br>Col. 9, Line 11 | Replace "subjects" with --subject's--. |
| CLAIM 8<br>Col. 10, Line 1 | Replace "the method" with --The method--. |
| CLAIM 9<br>Col. 10, Line 16 | Replace "maps," with --maps;--. |
| CLAIM 10<br>Col. 10, Line 20 | Replace "the method" with --The method--. |
| CLAIM 11<br>Col. 10, Line 23 | Replace "the method" with --The method--. |
| CLAIM 12<br>Col. 10, Line 25 | Replace "the method" with --The method--. |

Signed and Sealed this

First Day of December, 2009

David J. Kappos
*Director of the United States Patent and Trademark Office*